United States Patent
Hammond, IV et al.

(10) Patent No.: US 10,109,462 B2
(45) Date of Patent: Oct. 23, 2018

(54) DUAL RADIO-FREQUENCY TUNER FOR PROCESS CONTROL OF A PLASMA PROCESS

(71) Applicant: Applied Materials, Inc., Santa Clara, CA (US)

(72) Inventors: Edward P. Hammond, IV, Hillsborough, CA (US); Abdul Aziz Khaja, San Jose, CA (US); Tza-Jing Gung, San Jose, CA (US)

(73) Assignee: APPLIED MATERIALS, INC., Santa Clara, CA (US)

(\*) Notice: Subject to any disclaimer, the term of this patent is extended or adjusted under 35 U.S.C. 154(b) by 0 days.

(21) Appl. No.: 15/920,057

(22) Filed: Mar. 13, 2018

(65) Prior Publication Data
US 2018/0261431 A1     Sep. 13, 2018

Related U.S. Application Data

(60) Provisional application No. 62/470,718, filed on Mar. 13, 2017.

(51) Int. Cl.
*H01J 37/32*     (2006.01)

(52) U.S. Cl.
CPC .............. *H01J 37/32183* (2013.01); *H01J 2237/24564* (2013.01); *H01J 2237/3321* (2013.01); *H01J 2237/3323* (2013.01)

(58) Field of Classification Search
CPC ........... H01J 37/32165; H01J 37/32082; H01J 37/32183; H01J 37/32091; H01J 37/321; H01J 37/32339; H01J 37/32009; C23C 16/45561; C23C 16/481; C23C 16/515; C23C 16/505

See application file for complete search history.

(56) References Cited

U.S. PATENT DOCUMENTS

| | | | |
|---|---|---|---|
| 6,304,424 B1 * | 10/2001 | Mett | H01L 21/6831 279/128 |
| 6,610,169 B2 * | 8/2003 | Nguyen | C23C 16/45536 118/722 |
| 6,841,943 B2 * | 1/2005 | Vahedi | H01J 37/32165 118/723 I |
| 2014/0302256 A1 | 10/2014 | Chen et al. | |

\* cited by examiner

*Primary Examiner* — Haissa Philogene
(74) *Attorney, Agent, or Firm* — Patterson + Sheridan, LLP

(57) ABSTRACT

A tuning apparatus enables control of the flow of radio-frequency (RF) current in a plasma processing chamber at multiple RF frequencies. The apparatus is configured to provide a first path to ground from the chamber for RF power at a first frequency and a second path to ground from the chamber for RF power at a second frequency, where the first path to ground and the second path to ground each include a variable energy storage element. When adjusted, the variable energy storage element in the first path to ground modifies the impedance of the first path to ground, thereby changing RF current flow through the first path to ground at the first frequency. Adjusting the variable energy storage element in the second path to ground modifies the impedance of the second path to ground, thereby changing RF current flow through the second path to ground at the second frequency.

20 Claims, 7 Drawing Sheets

DUAL RADIO-FREQUENCY TUNER FOR PROCESS CONTROL OF A PLASMA PROCESS

CROSS-REFERENCE TO RELATED APPLICATIONS

This application claims benefit of U.S. provisional patent application Ser. No. 62/470,718, filed Mar. 13, 2017, which is herein incorporated by reference.

BACKGROUND

Field

Embodiments described herein generally relate to radio-frequency plasma-processing systems and, more particularly, to a dual radio-frequency tuner for process control of a plasma process.

Description of the Related Art

In the fabrication of modern semiconductor devices, plasma-enhanced chemical vapor deposition (PECVD) is commonly employed for the formation of a thin film on a semiconductor substrate. Plasma processes in a PECVD chamber generally promote the disassociation of reactant gases that are distributed across a substrate surface during the PECVD process. Specifically, the application of radio frequency (RF) energy to the reaction zone proximate the substrate surface can create a plasma of highly reactive ionic species, thereby reducing the energy required for a chemical reaction to take place on the substrate surface and lowering the required temperature for a particular CVD process.

In general, the uniformity of certain properties of a CVD film across a substrate surface, such as thickness, internal stress, and crystalline structure, is critical for a robust and repeatable manufacturing process that includes the CVD film. Thus, ideally, each of these properties is perfectly uniform across the surface of the semiconductor substrate. In practice, perfect uniformity of any particular film property is never achieved, so an acceptable level of variation for each important film property is typically established to facilitate process control. However, as device geometries continue to be scaled down, achieving acceptable film property uniformity in CVD and other processes becomes increasingly difficult, since any particular film property can be very sensitive to a variety of factors, and the impact of each factor may vary for each technology process node. For example, subtle variations in plasma uniformity in a PECVD chamber may have little measurable effect on the uniformity of a particular thin film property when the chamber is employed for the 32 nm process node, but can be a major contributor to non-uniformity when the chamber is employed for the 28 nm process node and below.

Accordingly, there is a need in the art for systems and methods that facilitate improving the uniformity of film properties during plasma processing.

SUMMARY

In one example, an apparatus comprises a sensor array configured to measure radio frequency (RF) current that is transmitted via a conductor at a first frequency and RF current that is transmitted via the conductor at a second frequency; a first conductive path that electrically couples the conductor to ground, includes a first adjustable energy storage device, and is configured to have a lower impedance at the first frequency and a higher impedance at the second frequency; and a second conductive path that electrically couples the conductor to ground in parallel with the first conductive path, includes a second adjustable energy storage device, and is configured to have a higher impedance at the first frequency and a lower impedance at the second frequency.

In another example, a plasma processing chamber comprises: an electrically conductive element that is disposed around a substrate processing region of the plasma processing chamber and is electrically isolated from a substrate support of the plasma processing chamber; an electrode disposed within the substrate support; a first radio frequency (RF) current tuner that electrically couples the electrically conductive element to ground via a first conductive path and a second conductive path that is parallel with the first conductive path; and a second RF current tuner that electrically couples the electrode to ground via a third conductive path and a fourth conductive path that is parallel with the third conductive path, wherein the first conductive path includes a first adjustable energy storage device and is configured to have a lower impedance at a first frequency and a higher impedance at a second frequency, the second conductive path includes a second adjustable energy storage device and is configured to have a higher impedance at the first frequency and a lower impedance at the second frequency, the third conductive path includes a third adjustable energy storage device and is configured to have a lower impedance at the first frequency and a higher impedance at the second frequency, and the fourth conductive path includes a fourth adjustable energy storage device and is configured to have a higher impedance at the first frequency and a lower impedance at the second frequency.

In another example, a method for controlling a plasma process comprises: forming a plasma in a substrate processing region of a plasma processing chamber; adjusting an impedance at a first frequency of a first conductive path to ground for an electrically conductive element that is disposed around the substrate processing region and is electrically isolated from a substrate support of the plasma processing chamber; adjusting an impedance at a second frequency of a second conductive path to ground for the electrically conductive element, wherein the second conductive path is parallel with the first conductive path; adjusting an impedance at the first frequency of a third conductive path to ground for the substrate support; and adjusting an impedance at the second frequency of a fourth conductive path to ground for the substrate support, wherein the fourth conductive path is parallel with the third conductive path.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Figure 1:
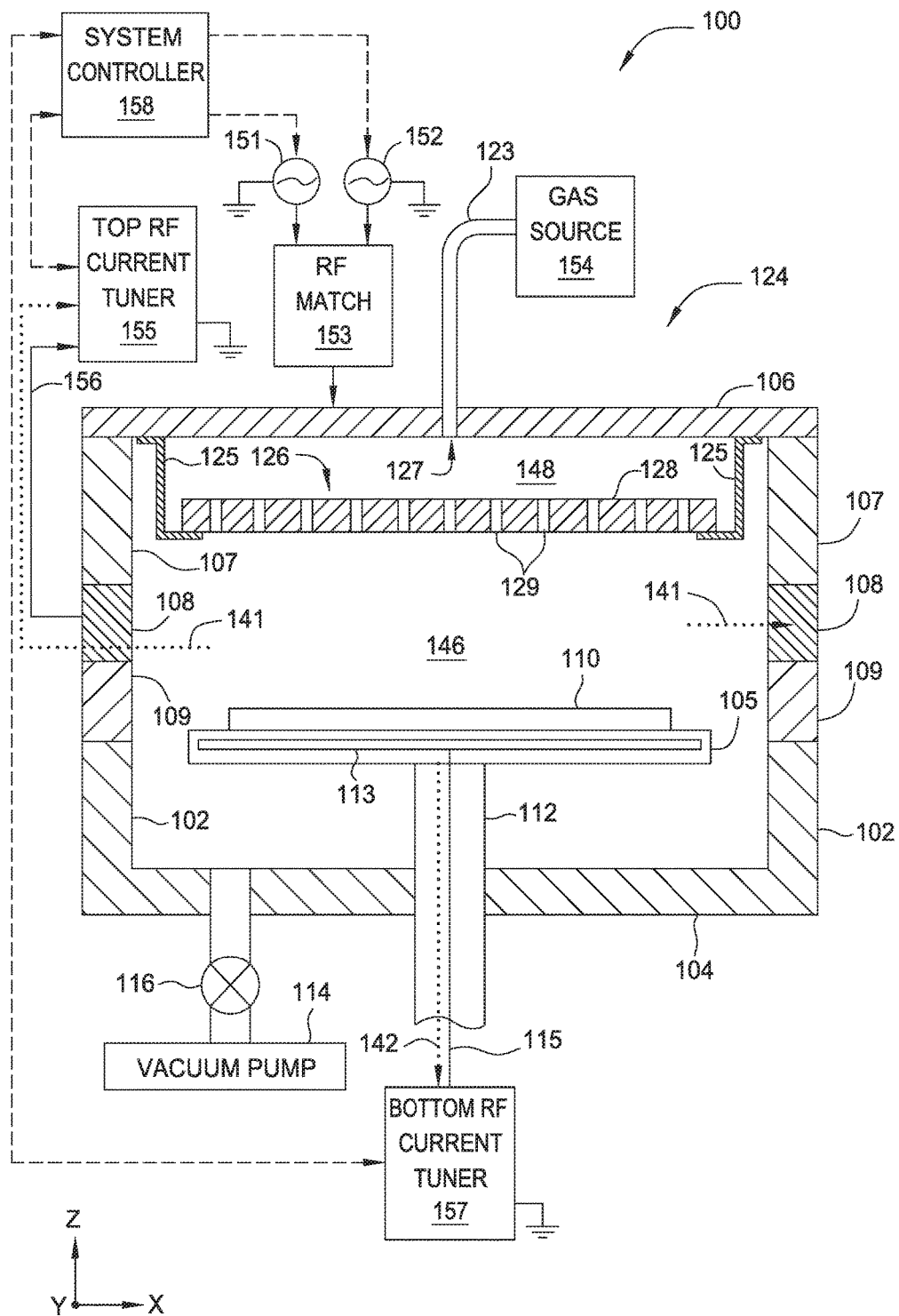
FIG. 1 is a schematic cross sectional view of a plasma processing chamber, configured according to various embodiments of the disclosure.

FIG. 1 is a schematic cross sectional view of a plasma processing chamber 100 configured according to various embodiments of the disclosure. By way of example, the embodiment of plasma processing chamber 100 in FIG. 1 is described in terms of a PECVD system, but any other plasma processing chamber may fall within the scope of the embodiments, including other plasma deposition chambers or plasma etch chambers. Plasma processing chamber 100 includes walls 102, a bottom 104, and a chamber lid 124 that together enclose a susceptor 105 and a processing region 146. Plasma processing chamber 100 further includes a vacuum pump 114, a first RF generator 151, a second RF generator 152, an RF match 153, a gas source 154, a top RF current tuner 155, a bottom RF current tuner 157, and a system controller 158, each coupled externally to the plasma processing chamber 100 as shown.

Walls 102 and bottom 104 may comprise an electrically conductive material, such as aluminum or stainless steel. Through one or more of walls 102, a slit valve opening may be present that is configured to facilitate insertion of a substrate 110 into and removal of substrate 110 from plasma processing chamber 100. A slit valve configured to seal slit valve opening may be disposed either inside or outside of plasma processing chamber 100. For clarity, no slit valve or slit valve opening is shown in FIG. 1.

Vacuum pump 114 is coupled to plasma processing chamber 100 and is configured to adjust the vacuum level therein. As shown, a valve 116 may be coupled between plasma processing chamber 100 and vacuum pump 114. Vacuum pump 114 evacuates plasma processing chamber 100 prior to substrate processing and removes process gas therefrom during processing through valve 116. Valve 116 may be adjustable to facilitate regulation of the evacuation rate of plasma processing chamber 100. The evacuation rate through valve 116 and the incoming gas flow rate from gas source 154 determine chamber pressure and process gas residency time in plasma processing chamber 100.

Gas source 154 is coupled to plasma processing chamber 100 via a tube 123 that passes through chamber lid 124. Tube 123 is fluidly coupled to a plenum 148 between a backing plate 106 and a gas distribution showerhead 128 included in chamber lid 124. During operation, process gas introduced into plasma processing chamber 100 from gas source 154 fills plenum 148 and then passes through gas passages 129 formed in gas distribution showerhead 128 to uniformly enter processing region 146. In alternative embodiments, process gas may be introduced into processing region 146 via inlets and/or nozzles (not shown) that are attached to wall 102 in addition to or in lieu of gas distribution showerhead 128.

Susceptor 105 may include any technically feasible apparatus for supporting a substrate during processing by plasma processing chamber 100, such as substrate 110 in FIG. 1. In some embodiments, susceptor 105 is disposed on a shaft 112 that is configured to raise and lower susceptor 105. In one embodiment, shaft 112 and susceptor 105 may be formed at least in part from or contain an electrically conductive material, such as tungsten, copper, molybdenum, aluminum, or stainless steel. Alternatively or additionally, susceptor 105 may be formed at least in part from or contain a ceramic material, such as aluminum oxide ($Al_2O_3$), aluminum nitride (AlN), silicon dioxide ($SiO_2$), and the like. In embodiments in which plasma processing chamber 100 is a capacitively coupled plasma chamber, susceptor 105 may be configured to contain an electrode 113. In such embodiments, a metal rod 115 or other conductor is electrically coupled to electrode 113 and is configured to provide a portion of a ground path for RF power delivered to plasma processing chamber 100. That is, metal rod 115 enables RF power delivered to plasma processing chamber 100 to pass through electrode 113 and out of plasma processing chamber 100 to ground.

In some embodiments, electrode 113 is also configured to provide an electrical bias from a DC power source (not shown) to enable electrostatic clamping of substrate 110 onto susceptor 105 during plasma processing. In such embodiments, susceptor 105 generally comprises a body including one or more ceramic materials, such as the above-described ceramic materials, or any other ceramic material suitable for use in an electrostatic chuck. In such embodiments, electrode 113 may be a mesh, such as an RF mesh, or a perforated sheet of material made of molybdenum (Mo), tungsten (W), or other material with a coefficient of thermal expansion that is substantially similar to that of the ceramic material or materials included in the body of susceptor 105. Together, electrode 113 and gas distribution showerhead 128 define the boundaries of processing volume 146 in which plasma is formed. For example, during processing, susceptor 105 and substrate 110 may be raised and positioned near the lower surface of showerhead 128 (e.g., within 10-30 mm) to form the at least partially enclosed processing region 146.

First RF generator 151 is a radio frequency (RF) power source configured to provide high-frequency power at a first RF frequency to discharge electrode 126 via RF match 153. Similarly, second RF generator 152 is an RF power source configured to provide high-frequency power at a second RF frequency to discharge electrode 126 via RF match 153. In some embodiments, first RF generator 151 includes an RF power supply capable of generating RF currents at a high frequency (HF), for example, about 13.56 MHz. Alternatively or additionally, first RF generator 151 includes a VHF generator capable of generating VHF power, such as VHF power at frequencies between about 20 MHz to 200 MHz or more. By contrast, second RF generator 152 includes an RF power supply capable of generating RF currents at so-called low frequency (LF) RF, for example, about 350 kHz. Alternatively or additionally, second RF generator 152 includes an RF generator capable of generating RF power at frequencies between about 1 kHz to about 1 MHz. First RF generator 151 and second RF generator 152 are configured to facilitate generation of a plasma between discharge electrode 126 and susceptor 105.

Discharge electrode 126 may include a process gas distribution element, such as gas distribution showerhead 128 (as shown in FIG. 1), and/or an array of gas injection nozzles, through which process gases are introduced into processing region 146. Discharge electrode 126, i.e., gas distribution showerhead 128, may be oriented substantially parallel to the surface of substrate 110, and capacitively couples plasma source power into processing region 146, which is disposed between substrate 110 and gas distribution showerhead 128.

RF match 153 may be any technically feasible impedance matching apparatus that is coupled between first RF generator 151 and the powered electrode of plasma processing chamber 100, i.e., gas distribution showerhead 128. RF match 153 is also coupled between second RF generator 152 and the powered electrode of plasma processing chamber 100. RF match 153 is configured to match a load impedance (plasma processing chamber 100) to the source or internal impedance of a driving source (first RF generator 151, second RF generator 152) to enable the maximum transfer of RF power from first RF generator 151 and second RF generator 152 to plasma processing chamber 100.

Forming a portion of walls 102 are an upper isolator 107, a tuning ring 108, and a lower isolator 109. Upper isolator 107 is configured to electrically isolate tuning ring 108, which is formed from an electrically conductive material, from backing plate 106, which in some embodiments is energized with RF power during operation. Thus, upper isolator 107 is positioned between backing plate 106 and tuning ring 108, and prevents tuning ring 108 from being energized with RF power via backing plate 106. In some embodiments, upper isolator 107 is configured as a ceramic ring or annulus that is positioned concentrically about processing region 146. Similarly, lower isolator 109 is configured to electrically isolate tuning ring 108 from chamber walls 102. Walls 102 are typically formed from an electrically conductive material, and can therefore act as a ground path for a portion of RF power delivered to plasma processing chamber 100 during processing. Thus, lower isolator 109 enables tuning ring 108 to be part of a different ground path for RF power delivered to plasma processing chamber 100 than that of walls 102. In some embodiments, upper isolator 107 is configured as a ceramic ring, or is configured to include a ceramic ring that is positioned concentrically about processing region 146.

Tuning ring 108 is disposed between the upper isolator 107 and lower isolator 109, is formed from an electrically conductive material, and is disposed adjacent processing region 146. For example, in some embodiments, tuning ring 108 is formed from a suitable metal, such as aluminum, copper, titanium, or stainless steel. In some embodiments, tuning ring 108 is a metallic ring or annulus that is positioned concentrically about susceptor 105 and substrate 110 during processing of substrate 110. In addition, tuning ring 108 is electrically coupled to ground via top RF current tuner 155 via a conductor 156, as shown. Thus, tuning ring 108 is not a powered electrode, and is generally disposed outside of and around processing region 146. In one example, the tuning ring 108 is positioned in a plane substantially parallel with substrate 110, and is part of a ground path for the RF energy used to form a plasma in plasma processing region 146. As a result, an additional RF ground path 141 is established between gas distribution showerhead 128 and ground, via top RF current tuner 155. Thus, by changing the impedance of top RF current tuner 155 at a particular frequency, the impedance for RF ground path 141 at that particular frequency changes, causing a change in the RF field that is coupled to tuning ring 108 at that frequency. Therefore, the shape of plasma in processing region 146 may be independently modulated along the +/−X and Y-directions for the RF frequency associated with either first RF generator 151 or second RF generator 152. That is, the shape, volume or uniformity of the plasma formed in the processing region 146 may be independently modulated for multiple RF frequencies across the surface of substrate 110 by use, for example, of the tuning ring 108 or vertically between substrate 110 and gas distribution showerhead 128 using the electrode 113. Operation of top RF current tuner 155 is described in greater detail below in conjunction with FIG. 2.

System controller 158 is configured to control the components and functions of plasma processing chamber 100, such as vacuum pump 114, first RF generator 151, second RF generator 152, RF match 153, gas source 154, top RF current tuner 155, and bottom RF current tuner 157. As such, system controller 158 receives sensor inputs, e.g., voltage-current inputs from top RF current tuner 155 and bottom RF current tuner 157, and transmits control outputs as required for operation of plasma processing chamber 100. The functionality of controller 158 may include any technically feasible implementation, including via software, hardware, and/or firmware, and may be divided between multiple separate controllers associated with plasma processing chamber 100.

It is believed that by delivering different frequencies of RF power to a processing region of a plasma processing chamber during a plasma enhanced deposition process operation the properties of a deposited film can be adjusted. For example, adjusting the low-frequency RF plasma power and/or frequency delivered to the processing region 146, i.e., forming an RF plasma in the 1 kHz to 1 MHz regime, can be beneficial to adjust some deposited film properties, such as film stress, while adjusting the high-frequency RF plasma power and/or frequency delivered to the processing region 146, i.e., forming an RF plasma in the 1 MHz to 200 MHz regime, can be beneficial to adjust other deposited film properties, such as thickness uniformity. According to various embodiments of the disclosure, a tuning apparatus enables independent control of the flow of RF current in plasma processing chamber 100 at multiple RF frequencies. In some embodiments, such a tuning apparatus is employed at multiple locations in plasma processing chamber 100, i.e., top RF current tuner 155 and bottom RF current tuner 157.

Top RF current tuner 155, as noted above, is electrically coupled to tuning ring 108 and is terminated to ground, thereby providing a controllable RF ground path 141 for plasma processing chamber 100. Similarly, bottom RF current tuner 157 is electrically coupled to metal rod 115 and is also terminated to ground, thereby providing a different controllable RF ground path 142 for plasma processing chamber 100. As described herein, top RF current tuner 155 and bottom RF current tuner 157 are each configured to control the flow of RF current to ground at multiple RF frequencies. Thus, the distribution of RF current at a first RF frequency between tuning ring 108 and metal rod 115 can be controlled independently from the distribution of RF current at a second RF frequency between tuning ring 108 and metal rod 115. Embodiments of top RF current tuner 155 are described below in conjunction with FIGS. 2, 4, and 5, and embodiments of bottom RF current tuner 157 are described below in conjunction with FIG. 3.

Figure 2:
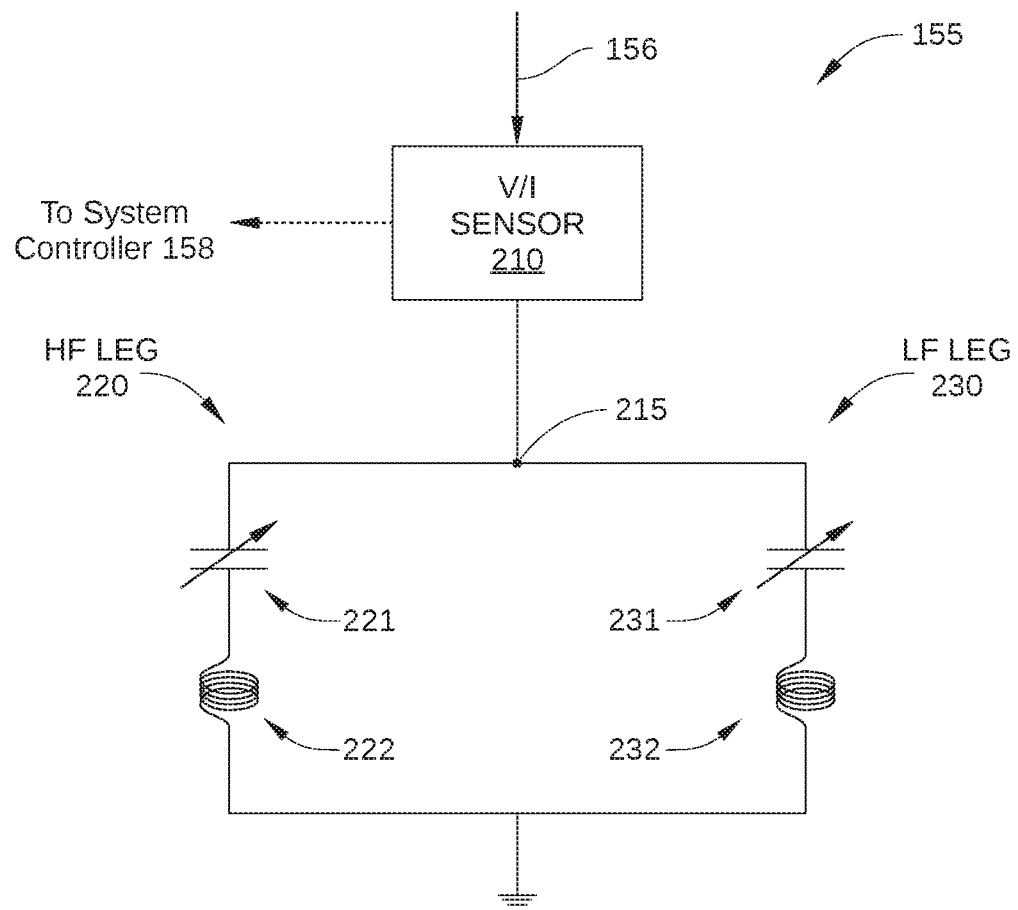
FIG. 2 is a block diagram illustrating a top radio frequency (RF) current tuner, according to various embodiments of the disclosure.

FIG. 2 is a block diagram illustrating the top RF current tuner 155 illustrated in FIG. 1, according to various embodiments of the disclosure. As shown, top RF current tuner 155 includes a voltage-current sensor 210 electrically coupled to a high-frequency (HF) leg 220 and a low frequency (LF) leg 230 of a current control circuit, where HF leg 220 and LF leg 230 are each a conductive path to ground for RF energy delivered to processing region 146. It is noted that HF leg 220 and LF leg 230 are each included as parallel portions of RF ground path 141 illustrated in FIG. 1.

Voltage-current sensor 210 may be any technically feasible RF voltage-current sensor suitable for measuring RF voltage and RF current at the frequencies delivered to processing region 146 by first RF generator 151 and by second RF generator 152. Generally, voltage-current sensor 210 is an array of multiple sensors, i.e., at least one voltage sensor and at least one current sensor. In some embodiments, the functionality of voltage-current sensor 210 may be divided between two separate voltage-current sensors, one configured for measuring high-frequency RF and one configured for measuring low-frequency RF. In such embodiments, one of the separate voltage-current sensors may be disposed on HF leg 220 after the node 215 and the other separate voltage-current sensor may be disposed on LF leg 230 after the node 215. In either case, voltage-current sensor 210 is configured to measure RF current that is transmitted via conductor 156 at a first frequency and RF current that is transmitted via conductor 156 at a second frequency.

HF leg 220 is configured to provide a variable termination for high-frequency RF current to ground, for example for the frequency of RF power delivered to processing region 146 of plasma processing chamber 100 by first RF generator 151. As such, HF leg 220 includes a variable capacitor 221 in series with an inductor 222, both of which are selected to provide a low-impedance path to ground for the RF power delivered to processing region 146 by first RF generator 151, i.e., high-frequency RF power. Variable capacitor 221 and inductor 222 are further selected to provide a high-impedance path to ground for the RF power delivered to processing region 146 by second RF generator 152, i.e., low-frequency RF power.

Variable capacitor 221 is an electrical component configured to store electrical energy in an electric field. Further, variable capacitor 221 is configured with a capacitance that can be repeatably changed, either mechanically or electronically, in response to a suitable control input. Inductor 222 is an electrical component configured to store electrical energy in a magnetic field. Because variable capacitor 221 and inductor 222 are selected so that HF leg 220 is a high-impedance path to ground for low-frequency RF power, very little of the power delivered to processing region 146 from second RF generator 152 follows HF leg 220 to ground. Conversely, because variable capacitor 221 and inductor 222 are selected so that HF leg 220 is a low-impedance path to ground for high-frequency RF power, a significant portion of the high-frequency RF power delivered to processing region 146 from first RF generator 151 follows HF leg 220 to ground. By adjusting variable capacitor 221, this portion of the RF power delivered to processing region 146 from first RF generator 151 is modified, thereby changing how much high-frequency RF current passes through top RF current tuner 155 and tuning ring 108.

LF leg 230 is configured to provide a variable termination for low-frequency RF current to ground, for example for the frequency of RF power delivered to processing region 146 by second RF generator 152. As such, LF leg 230 includes a variable capacitor 231 in series with an inductor 232, which together are selected to provide a low-impedance path to ground for the RF power delivered to processing region 146 by second RF generator 152, i.e., low-frequency RF power. Variable capacitor 231 and inductor 232 are further selected to provide a high-impedance path to ground for the RF power delivered to processing region 146 by first RF generator 151, i.e., high-frequency RF power. Variable capacitor 231 and inductor 232 may be substantially similar in configuration to variable capacitor 221 and inductor 222, described above.

Because variable capacitor 231 and inductor 232 are selected so that LF leg 230 is a high-impedance path to ground for high-frequency RF power, very little of the high-frequency RF power delivered to processing region 146 from first RF generator 151 follows LF leg 230 to ground. Conversely, because variable capacitor 231 and inductor 232 are selected so that LF leg 230 is a low-impedance path to ground for low-frequency RF power, a significant portion of the low-frequency RF power delivered to processing region 146 from second RF generator 152 follows LF leg 230 to ground. Thus, by adjusting variable capacitor 231, this portion of the low-frequency RF power delivered to processing region 146 from second RF generator 152 is modified, thereby changing how much low-frequency RF current passes through top RF current tuner 155.

In operation, i.e., while plasma is generated in processing region 146 (shown in FIG. 1), top RF current tuner 155 receives RF current at multiple frequencies from first RF generator 151 and second RF generator 152, via conductor 156. More specifically, a portion of the RF power delivered to processing region 146 is received by top RF current tuner 155, while a remainder portion of the RF power delivered to processing region 146 is received by bottom RF current tuner 157.

As set forth above, adjusting variable capacitor 221 changes the magnitude of high-frequency RF current flowing through the HF leg 220 of the top RF current tuner 155. For example, when the impedance at high frequency of HF leg 220 is increased, the magnitude of high-frequency RF current flowing through HF leg 220 decreases. In addition, a corresponding increase in the magnitude of high-frequency RF current flowing through bottom RF current tuner 157 occurs. Thus, the distribution of high-frequency RF current flowing to ground via RF ground path 141 vs. RF ground path 142 can be controlled by adjusting the capacitance of variable capacitor 221.

Similarly, adjusting variable capacitor 231 changes the magnitude of low-frequency RF current flowing through LF leg 230. For example, when the impedance at low frequency of LF leg 230 is increased, the magnitude of low-frequency RF current flowing through LF leg 230 decreases. In addition, a corresponding increase in the magnitude of low-frequency RF current flowing through bottom RF current tuner 157 occurs. Thus, the distribution of low-frequency RF current flowing to ground via RF ground path 141 vs. via RF ground path 142 can be controlled by adjusting the capacitance of variable capacitor 231.

In some embodiments, RF current and RF voltage measured by voltage-current sensor 210 can be employed by the system controller 158 during substrate processing to determine whether variable capacitor 221 and/or variable capacitor 231 should be adjusted. Alternatively, variable capacitor 221 RF current and RF voltage measured by voltage-current sensor 210 may be employed prior to substrate processing to determine specific fixed settings for variable capacitor 221 and/or variable capacitor 231 for a specific process. Such settings are then respectively applied to variable capacitor 221 and/or variable capacitor 231 by system controller 158 during substrate processing with that specific process.

In sum, top RF current tuner 155 provides an additional degree of freedom in controlling processes performed in plasma processing chamber 100, since the distribution of low-frequency RF current in plasma processing chamber 100 and the distribution of high-frequency RF current in plasma processing chamber 100 can be changed independently. Bottom RF current tuner 157, when used in lieu of or in conjunction with top RF current tuner 155, can provide a similar degree of freedom in controlling processes performed in plasma processing chamber 100, as described below in conjunction with FIG. 3.

Figure 3:
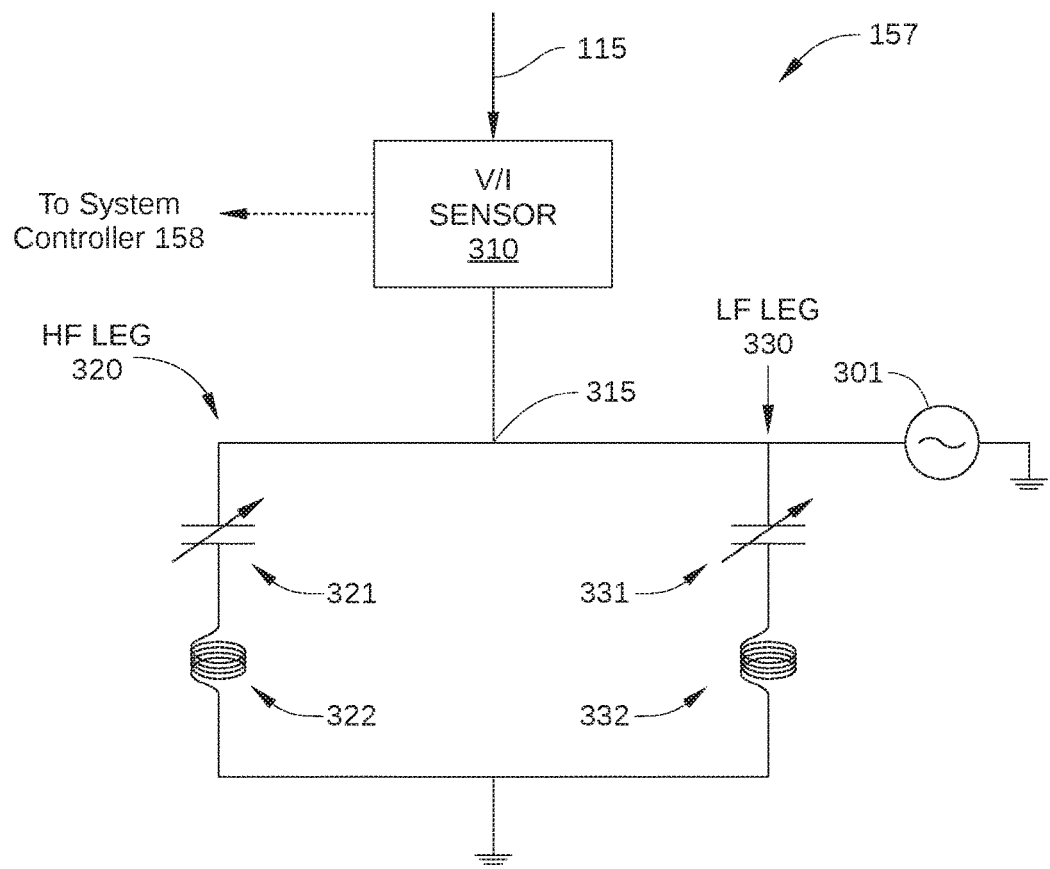
FIG. 3 is a block diagram illustrating a bottom RF current tuner, according to various embodiments of the disclosure.

FIG. 3 is a block diagram illustrating bottom RF current tuner 157, according to various embodiments of the disclosure. In the embodiment illustrated in FIG. 3, bottom RF current tuner 157 may be similar in configuration to top RF current tuner 155, and includes a voltage-current sensor 310 electrically coupled to an HF leg 320 and a LF leg 330 of a current control circuit at node 315. HF leg 320 and LF leg 330 are each a conductive path to ground for RF energy delivered to processing region 146. It is noted that HF leg 320 and LF leg 330 are each included as parallel portions of RF ground path 142 illustrated in FIG. 1. In embodiments in which susceptor 105 in FIG. 1 includes an electrostatic chucking capability, bottom RF current tuner 157 may be electrically coupled to a DC power supply 301 for delivering a DC voltage to the electrode 113, as shown in FIGS. 1 and 3, for providing chucking voltage.

Voltage-current sensor 310 may be similar in configuration to voltage-current sensor 210, variable capacitors 321 and 331 may be similar in configuration to variable capacitors 221 and 231, and inductors 322 and 332 may be similar in configuration to inductors 222 and 232. Thus, HF leg 320 is configured to provide a variable termination for high-frequency RF current to ground, for example for the frequency of RF power delivered to processing region 146 by first RF generator 151. Similarly, LF leg 330 is configured to provide a variable termination for low-frequency RF current to ground, for example for the frequency of RF power delivered to processing region 146 by second RF generator 152. Therefore, by adjusting variable capacitor 321, the magnitude of high-frequency RF current that passes through bottom current tuner 157 is changed, and by adjusting variable capacitor 331, the magnitude of low-frequency RF current that passes through bottom current tuner 157 is changed.

In the embodiment illustrated in FIG. 2, the adjustability of HF leg 220 is enabled by variable capacitor 221, and the adjustability of LF leg 230 is enabled by variable capacitor 231. Alternatively or additionally, in some embodiments, adjustability of an HF leg and/or an LF leg in a top RF current tuner is enabled via an adjustable inductor. In such embodiments, inductor 222 and/or inductor 232 are each configured as an adjustable inductor. One such embodiment is illustrated in FIG. 4.

Figure 4:
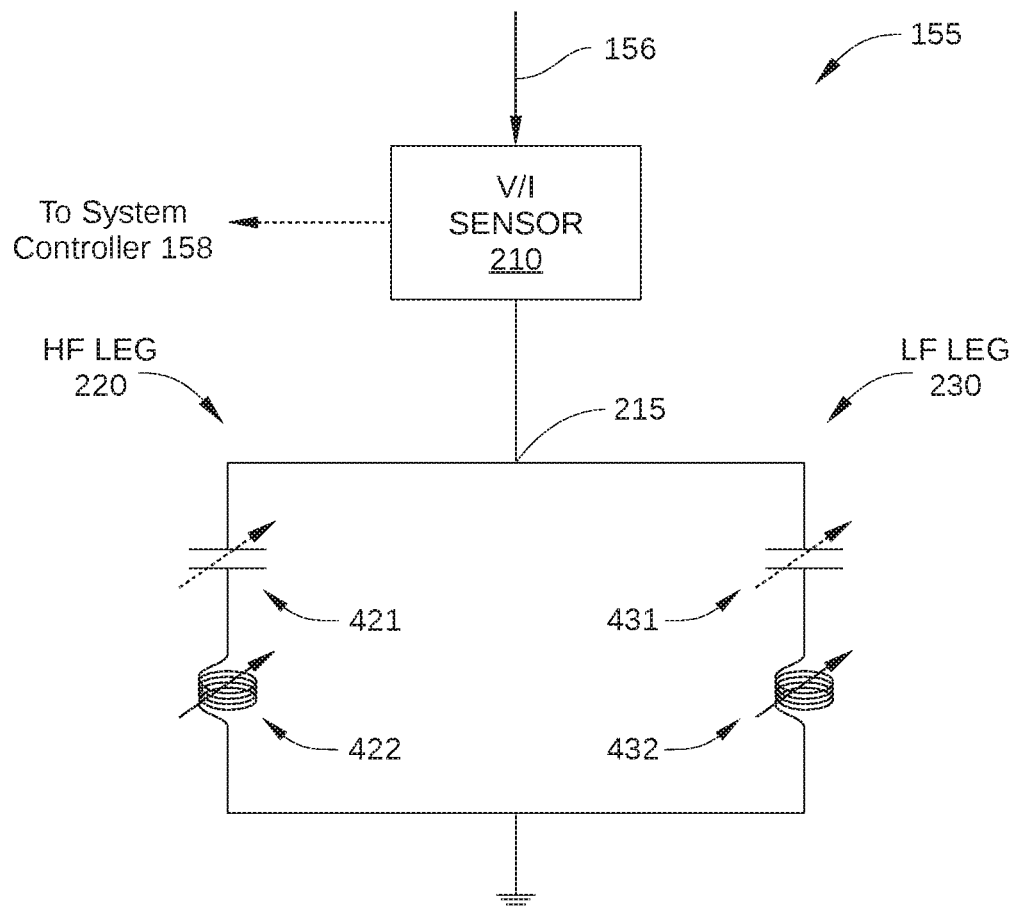
FIG. 4 is a block diagram illustrating a top RF current tuner, according to various embodiments of the disclosure.

FIG. 4 is a block diagram illustrating another configuration of a top RF current tuner 155, according to various embodiments of the disclosure. In the embodiment illustrated in FIG. 4, top RF current tuner 155 may be similar in configuration to the embodiment of top RF current tuner 155 illustrated in FIG. 2, except that HF leg 220 includes an adjustable inductor 422 and a capacitor 421, which may be a fixed capacitor or a variable capacitor. In addition, LF leg 230 includes an adjustable inductor 432 and a capacitor 431, which may be a fixed capacitor or a variable capacitor. The inductance of adjustable inductors 422 and 432 may be controlled during substrate processing so that a magnitude of high-frequency RF current passing though top RF current tuner 155 remains constant. Alternatively, the inductance of adjustable inductors 422 and 432 may be fixed at a particular value for a specific process performed on substrate in plasma processing chamber 100.

In operation, the distribution of high-frequency RF current flowing to ground via RF ground path 141 vs. via RF ground path 142 can be controlled by adjusting the inductance of adjustable inductor 422. Simultaneously and independently, the distribution of low-frequency RF current flowing to ground via RF ground path 141 vs. via RF ground path 142 can be controlled by adjusting the inductance of adjustable inductor 432. Thus, the adjustability of HF leg 220 and/or LF let 230 can be enabled with the inclusion of any suitable adjustable energy storage device in HF leg 220 or LF leg 230. Furthermore, bottom RF current tuner 157 can be similarly configured with adjustable inductors in lieu of or in addition to variable capacitors 321 and 331.

In the embodiments illustrated in FIGS. 2, 3 and 4, system controller 158 performs the logic and control functions associated with voltage-current sensors 210 and 310, variable capacitors 221, 231, 321, and 331, and adjustable inductors 422 and 432. In some embodiments, a tuner controller associated with an RF current tuner may instead perform such control functions. One such embodiment is illustrated in FIG. 5, and another such embodiment is illustrated in FIG. 6.

Figure 5:
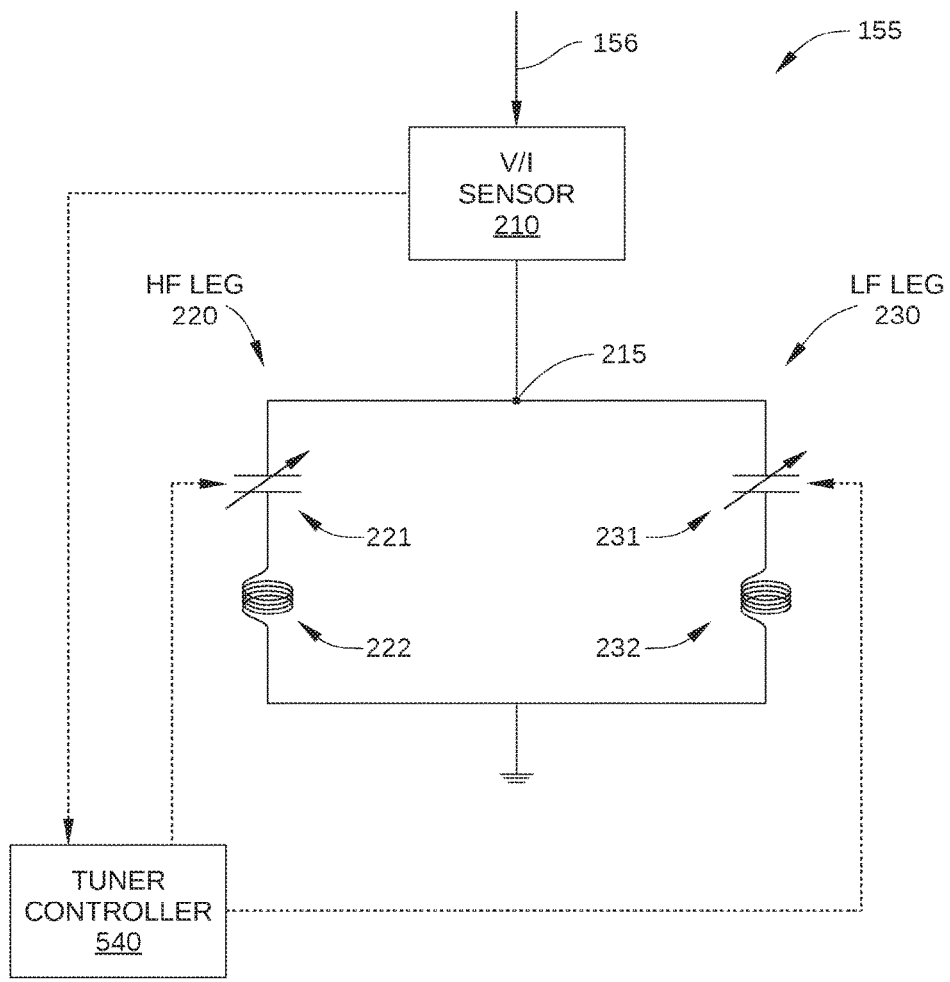
FIG. 5 is a block diagram illustrating a top RF current tuner, according to various embodiments of the disclosure.

FIG. 5 is a block diagram illustrating top RF current tuner 155, according to various embodiments of the disclosure. In the embodiment illustrated in FIG. 5, top RF current tuner 155 may be similar in configuration to the embodiment of top RF current tuner 155 illustrated in FIG. 2. In addition, top RF current tuner 155 includes a tuner controller 540. Tuner controller 540 is configured to receive RF current and/or RF voltage measurements from voltage-current sensor 210, determine whether the magnitude of high-frequency RF current or low-frequency RF current passing though top RF current tuner 155 should be modified, and adjust variable capacitor 221 and/or 231 accordingly. For example, in some embodiments, the tuner controller 540 is configured to receive a high-frequency RF current measurement from the voltage current sensor 210, compare the measured high-frequency RF current to a high-frequency RF current set point associated with a particular process in plasma processing chamber 100, and adjust variable capacitor 221 accordingly. In addition, in such embodiments, tuner controller 540 is further configured to receive a low-frequency RF current measurement from voltage current sensor 210, compare the measured low-frequency RF current to a low-frequency RF current set point associated with the particular process in plasma processing chamber 100, and adjust variable capacitor 231 accordingly. In embodiments in which top RF current tuner 155 includes one or more adjustable inductors, such as adjustable inductors 422 and/or 432 (shown in FIG. 4), tuner controller 540 is configured to adjust the variable inductors in lieu of or in addition to adjusting variable capacitors 221 and/or 231. In either case, the flow of high-frequency RF current through top RF current tuner 155 is controlled independently from the flow of low-frequency RF current through top RF current tuner 155.

The functionality of tuner controller 540 may include any technically feasible implementation, including via software, hardware, and/or firmware. Thus, in some embodiments, tuner controller 540 may be implemented as any suitable programmable processor such as a CPU, an application-specific integrated circuit (ASIC), a field programmable gate array (FPGA), any other type of processing unit, or a combination of different processing units. In general, tuner controller 540 may be any technically feasible hardware or firmware unit capable of processing data and/or executing software applications to facilitate operation of top RF current tuner 155 as described herein. The above-described high-frequency RF current set point and low-frequency RF current set point may be stored locally in tuner controller 540, for example in a memory, or provided by system controller 158.

Figure 6:
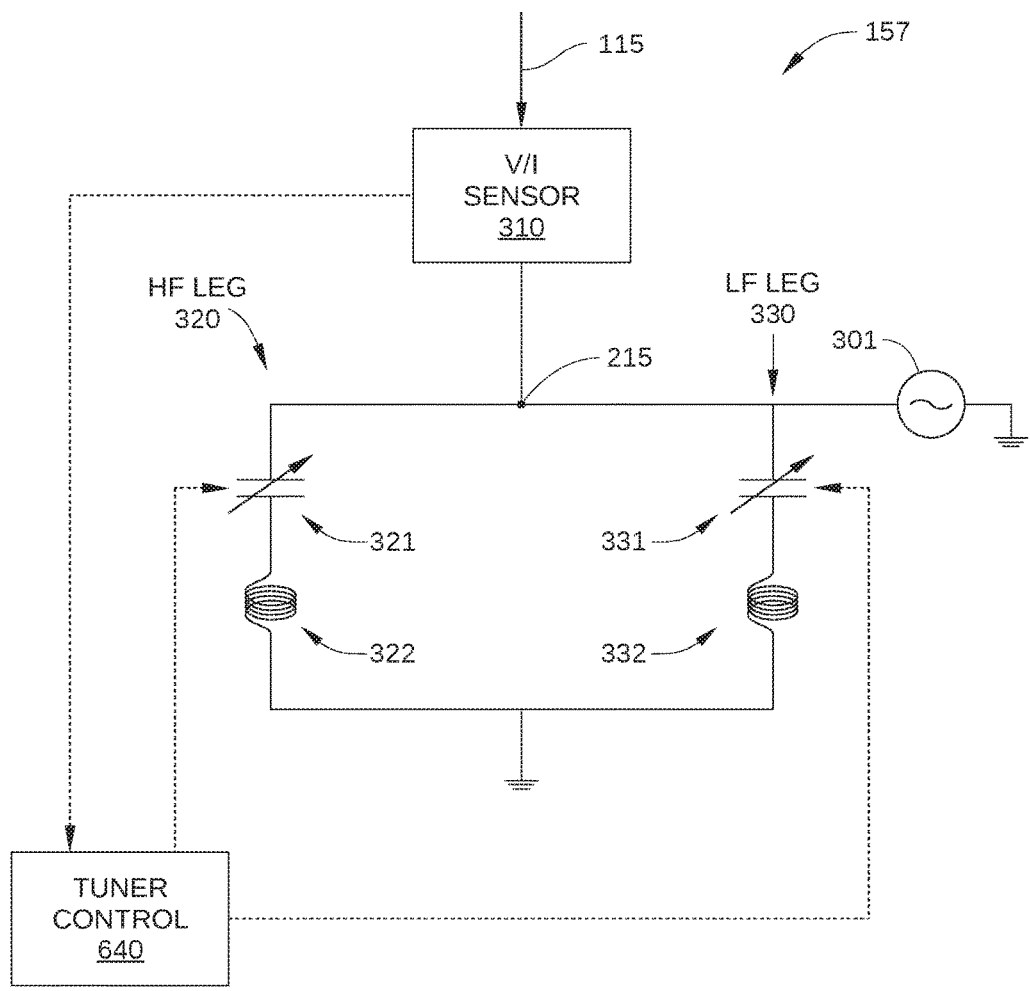
FIG. 6 is a block diagram illustrating bottom RF current tuner, according to various embodiments of the disclosure.

FIG. 6 is a block diagram illustrating bottom RF current tuner 157, according to various embodiments of the disclosure. In the embodiment illustrated in FIG. 6, bottom RF current tuner 157 may be similar in configuration to the embodiment of bottom RF current tuner 157 illustrated in FIG. 3. In addition, bottom RF current tuner 157 includes a tuner controller 640, which may be similar in configuration and operation to tuner controller 540 in FIG. 5. As such, tuner controller 640 is configured to receive RF current and/or RF voltage measurements from voltage-current sensor 310, determine whether the magnitude of high-frequency RF current or low-frequency RF current passing though bottom RF current tuner 157 should be modified, and adjust variable capacitor 321 and/or 331 accordingly. In embodiments in which bottom RF current tuner 157 includes one or more adjustable inductors similar to adjustable inductors 422 and/or 432 (shown in FIG. 4), tuner controller 640 is configured to adjust the variable inductors in lieu of or in addition to adjusting variable capacitors 321 and/or 331. In either case, the flow of high-frequency RF current through bottom RF current tuner 157 is controlled independently from the flow of low-frequency RF current through bottom RF current tuner 157.

Figure 7:
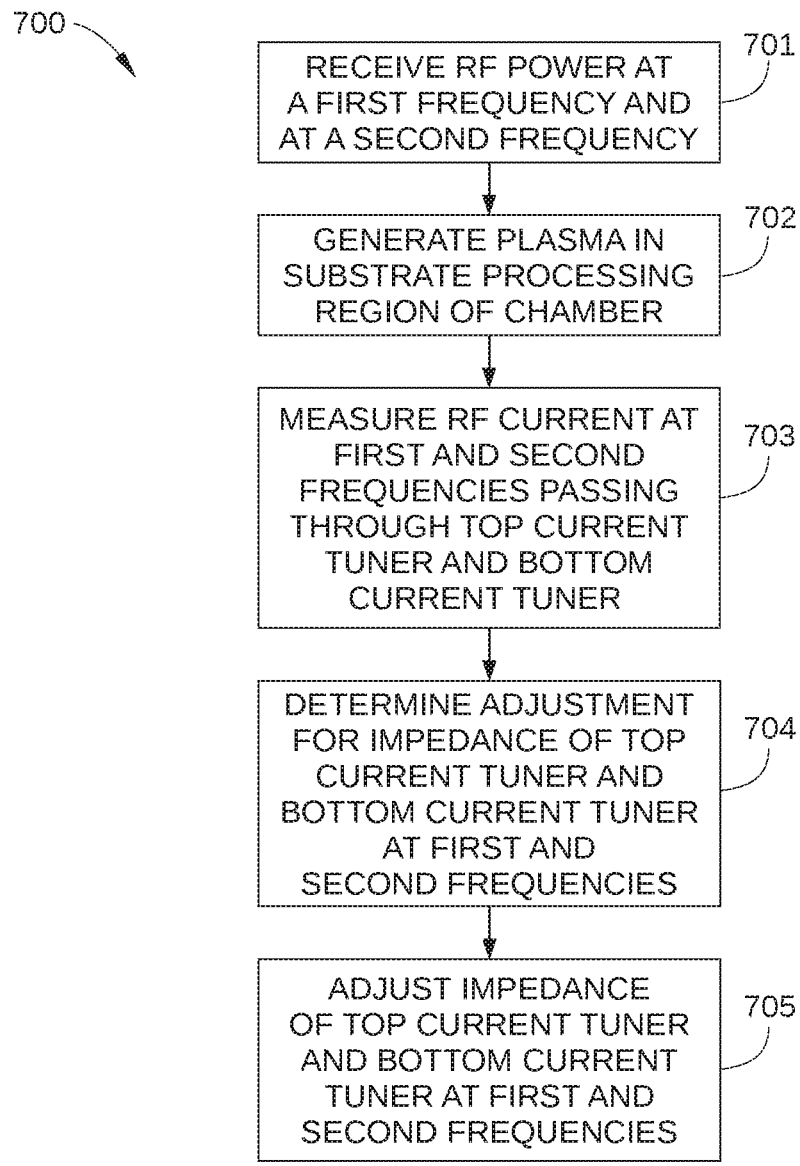
FIG. 7 sets forth a flow chart of process operations for controlling a plasma process, according to various embodiments of the disclosure.

FIG. 7 sets forth a flow chart of process operations for controlling a plasma process, according to various embodiments of the disclosure. Although the process operations are described in conjunction with plasma processing chamber 100 in FIGS. 1-6, persons skilled in the art will understand that the process operations may also be performed with other types of RF plasma systems. The control algorithms for the method operations may reside in system controller 158, tuner controller 540, or tuner controller 640. These control algorithms may be implemented in whole or in part as software- or firmware-implemented logic, and/or as hardware-implemented logic circuits.

A method 700 begins at operation 701, in which plasma processing chamber 100 receives RF power, via RF match 153, at a first frequency from first RF generator 151, and RF power at a second frequency from second RF generator 152. For example, first RF generator 151 generates 2500 W of RF power at 13.5 MHz and second RF generator 152 generates 1000 W of RF power at 350 kHz.

In operation 702, a plasma is generated in substrate processing region 146 when a suitable mixture of process gases is introduced into substrate processing region 146 to achieve a desired pressure.

In operation 703, a sensor array associated with top RF current tuner 155, such as voltage-current sensor 210, measures a magnitude of RF current passing through top RF current tuner 155 at the first frequency and a magnitude of RF current passing through top RF current tuner 155 at the second frequency. It is noted that the RF current passing through top RF current tuner 155 at the first frequency passes almost entirely through a first conductive path to ground (i.e., HF leg 220), while the RF current passing through top RF current tuner 155 at the second frequency passes almost entirely through a second conductive path to ground (i.e., LF leg 230).

Also in operation 703, a sensor array associated with bottom RF current tuner 157, such as voltage-current sensor 310, measures a magnitude of RF current passing through bottom RF current tuner 157 at the first frequency and a magnitude of RF current passing through bottom RF current tuner 157 at the second frequency. It is noted that the RF current passing through bottom RF current tuner 157 at the first frequency passes almost entirely through a third conductive path to ground (i.e., HF leg 320), while the RF current passing through bottom RF current tuner 157 at the second frequency passes almost entirely through a fourth conductive path to ground (i.e., LF leg 330).

In operation 704, system controller 158 or tuner controller 540 determines an adjustment for the impedance at the first frequency of the first conductive path to ground based on the magnitude of the RF current passing through top RF current tuner 155 at the first frequency in operation 703. For example, when the magnitude of the RF current passing through top RF current tuner 155 at the first frequency is within a predetermined frequency range, system controller 158 or tuner controller 540 determines that no change in the magnitude of the RF current at the first frequency is needed, and the adjustment for the impedance at the first frequency of the first conductive path is zero. Conversely, when the magnitude of the RF current passing through top RF current tuner 155 at the first frequency is outside the predetermined frequency range, system controller 158 or tuner controller 540 determines that the magnitude of the RF current at the first frequency should be changed. Thus, system controller 158 or tuner controller 540 calculates a suitable adjustment for the impedance of the first conductive path that will return the magnitude of the RF current passing through top RF current tuner 155 at the first frequency to within the predetermined frequency range. For instance, when the magnitude of the RF current at the first frequency is too high, system controller 158 or tuner controller 540 increases the impedance of the first conductive path, and when the magnitude of the RF current at the first frequency is too low, system controller 158 or tuner controller 540 decreases the impedance of the first conductive path.

In addition, system controller 158 or tuner controller 540 determines an adjustment in a similar fashion for the impedance at the second frequency of the second conductive path to ground based on the magnitude of the RF current passing through top RF current tuner 155 at the second frequency in operation 703. Similarly, system controller 158 or tuner controller 540 determines an adjustment for the impedance at the first frequency of the third conductive path to ground based on the magnitude of the RF current passing through bottom RF current tuner 157 at the first frequency in operation 703, and an adjustment for the impedance at the second frequency of the fourth conductive path to ground based on the magnitude of the RF current passing through bottom RF current tuner 157 at the second frequency in operation 703.

In operation 705, system controller 158 or tuner controller 540 adjusts the impedance at the first frequency of the first conductive path according to the adjustment determined in operation 705. For example, the capacitance of variable capacitor 221 is increased or decreased as needed to implement the adjustment for the impedance at the first frequency of the first conductive path that was determined in operation 704. As a result, a magnitude of RF current flowing at the first frequency through the first conductive path and through tuning ring 108 is changed.

Similarly, system controller 158 or tuner controller 540 adjusts the impedance at the second frequency of the second conductive path according to the corresponding adjustment determined in operation 705, the impedance at the first frequency of the third conductive path according to the corresponding adjustment determined in operation 705, and the impedance at the second frequency of the fourth conductive path according to the corresponding adjustment determined in operation 705. Thus, a magnitude of RF current flowing at the second frequency through the second conductive path and through tuning ring 108 is changed, a magnitude of RF current flowing at the first frequency through the third conductive path and through electrode 113 is changed, and a magnitude of RF current flowing at the second frequency through the fourth conductive path and through electrode 113 is changed.

It is noted that the above-described changes in the distribution of RF current in plasma processing chamber 100 at the first frequency can be performed independently of the above-described changes in the distribution of RF current in plasma processing chamber 100 at the second frequency. As a result, a plasma process in plasma processing chamber 100 can be better controlled, due to the additional degree of freedom provided by such independent control. For example, by adjusting the flow of high-frequency RF current to tuning ring 108 (e.g., via variable capacitor 221 in top RF current tuner 155 and variable capacitor 321 in bottom RF current tuner 157), thickness uniformity of a film deposited on a substrate in a PECVD process can be effected with little or no impact on film stress in the deposited film. Conversely, by adjusting the flow of low-frequency RF current to tuning ring 108 (e.g., via variable capacitor 231 in top RF current tuner 155 and variable capacitor 331 in bottom RF current tuner 157), film stress uniformity of a film deposited on a substrate in a PECVD process can be effected with little or no impact on thickness uniformity of the deposited film.

In some embodiments, during a plasma process in plasma processing chamber 100, a targeted ratio of the flow of high-frequency RF current to tuning ring 108 to the flow of high-frequency RF current to susceptor 105 can be achieved. Similarly, in some embodiments, during a plasma process in plasma processing chamber 100, a targeted ratio of the flow of low-frequency RF current to tuning ring 108 to the flow of low-frequency RF current to susceptor 105 can be achieved.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

While the foregoing is directed to embodiments of the present disclosure, other and further embodiments of the disclosure may be devised without departing from the basic scope thereof, and the scope thereof is determined by the claims that follow.

The invention claimed is:

1. An apparatus, comprising:
a sensor array configured to measure radio frequency (RF) current that is transmitted via a conductor at a first frequency and RF current that is transmitted via the conductor at a second frequency;
a first conductive path that electrically couples the conductor to ground, includes a first adjustable energy storage device, and is configured to have a lower impedance at the first frequency and a higher impedance at the second frequency; and
a second conductive path that electrically couples the conductor to ground in parallel with the first conductive path, includes a second adjustable energy storage device, and is configured to have a higher impedance at the first frequency and a lower impedance at the second frequency.

2. The apparatus of claim 1, wherein the sensor array comprises a first voltage-current sensor disposed on the first conductive path and a second voltage-current sensor disposes on the second conductive path.

3. The apparatus of claim 1, wherein the first adjustable energy storage device comprises a variable capacitor or an adjustable inductor, and the second adjustable energy storage device comprises a variable capacitor or an adjustable inductor.

4. The apparatus of claim 1, wherein the conductor comprises one of a metallic rod that is electrically coupled to a substrate support of a plasma processing chamber or a tuning ring that is disposed around a processing region of a plasma processing chamber.

5. The apparatus of claim 1, wherein the first conductive path includes a first capacitor in series with a first inductor, and the second conductive path includes a second capacitor in series with a second inductor.

6. The apparatus of claim 1, wherein the first adjustable energy storage device, the second adjustable energy storage device, and the sensor array are each coupled to a controller that is configured to control a first portion of the RF current to flow through the first adjustable energy storage device and a second portion of the RF current to flow through the second adjustable energy storage device.

7. A plasma processing chamber, comprising:
an electrically conductive element that is disposed around a substrate processing region of the plasma processing chamber and is electrically isolated from a substrate support of the plasma processing chamber;
an electrode disposed within the substrate support;
a first radio frequency (RF) current tuner that electrically couples the electrically conductive element to ground via a first conductive path and a second conductive path that is parallel with the first conductive path; and
a second RF current tuner that electrically couples the electrode to ground via a third conductive path and a fourth conductive path that is parallel with the third conductive path,
wherein
the first conductive path includes a first adjustable energy storage device and is configured to have a lower impedance at a first frequency and a higher impedance at a second frequency,
the second conductive path includes a second adjustable energy storage device and is configured to have a higher impedance at the first frequency and a lower impedance at the second frequency,
the third conductive path includes a third adjustable energy storage device and is configured to have a lower impedance at the first frequency and a higher impedance at the second frequency, and
the fourth conductive path includes a fourth adjustable energy storage device and is configured to have a higher impedance at the first frequency and a lower impedance at the second frequency.

8. The plasma processing chamber of claim 7, wherein the electrically conductive element comprises a tuning ring disposed between a first isolator and a second isolator disposed in a body of the plasma processing chamber.

9. The plasma processing chamber of claim 7, wherein the first adjustable energy storage device comprises a variable capacitor or an adjustable inductor and the second adjustable energy storage device comprises a variable capacitor or an adjustable inductor.

10. The plasma processing chamber of claim 7, further comprising a sensor array configured to measure RF current that is transmitted to the plasma processing chamber at a first frequency and RF current that is transmitted to the plasma processing chamber at a second frequency.

11. The plasma processing chamber of claim 10, wherein the first adjustable energy storage device, the second adjustable energy storage device, the third adjustable energy storage device, the fourth adjustable energy storage device, and the sensor array are each coupled to a controller that is configured to control a first portion of the RF current that is transmitted to the plasma processing chamber to flow through the electrically conductive element and a second portion of the RF current that is transmitted to the plasma processing chamber to flow through the electrode.

12. The plasma processing chamber of claim 7, further comprising a discharge electrode that is disposed adjacent to the substrate processing region and is configured to receive RF power from an RF power supply via an RF match disposed between the RF power supply and the plasma processing chamber.

13. A method for controlling a plasma process, the method comprising:
forming a plasma in a substrate processing region of a plasma processing chamber;
adjusting an impedance at a first frequency of a first conductive path to ground for an electrically conductive element that is disposed around the substrate processing region and is electrically isolated from a substrate support of the plasma processing chamber;
adjusting an impedance at a second frequency of a second conductive path to ground for the electrically conductive element, wherein the second conductive path is parallel with the first conductive path;
adjusting an impedance at the first frequency of a third conductive path to ground for the substrate support; and
adjusting an impedance at the second frequency of a fourth conductive path to ground for the substrate support, wherein the fourth conductive path is parallel with the third conductive path.

14. The method of claim 13, wherein adjusting the impedance at the first frequency of the first conductive path to ground results in a change in a magnitude of RF current flowing through the electrically conductive element at the first frequency, and adjusting the impedance at the second frequency of the second conductive path to ground results in a change in a magnitude of RF current flowing through the electrically conductive element at the second frequency.

15. The method of claim 13, further comprising receiving the RF current from an RF power supply via an RF match disposed between the RF power supply and the plasma processing chamber.

16. The method of claim 13, wherein adjusting the impedance at the first frequency of the third conductive path to ground results in a change in a magnitude of RF current flowing through the substrate support at the first frequency, and adjusting the impedance at the second frequency of the fourth conductive path to ground results in a change in a magnitude of RF current flowing through the substrate support at the second frequency.

17. The method of claim 13, wherein adjusting the impedance at the first frequency of the first conductive path to ground comprises at least one of changing a capacitance of a first variable capacitor disposed in the first conductive path to ground or changing an inductance of a first adjustable inductor disposed in the first conductive path to ground, and adjusting the impedance at the second frequency of the second conductive path to ground comprises at least one of changing a capacitance of a second variable capacitor disposed in the second conductive path to ground or changing an inductance of a second adjustable inductor disposed in the second conductive path to ground.

18. The method of claim 17, wherein the first conductive path to ground comprises one of the first variable capacitor in series with an inductor or a capacitor in series with the first adjustable inductor, and the second conductive path to ground comprises one of the second variable capacitor in series with an inductor or a capacitor in series with the second adjustable inductor.

19. The method of claim 13, further comprising, prior to adjusting the impedance at the first frequency of the first conductive path to ground, measuring a magnitude of RF current passing through the first conductive path to ground at the first frequency, and determining an adjustment for the impedance at the first frequency of the first conductive path to ground.

20. The method of claim 13, wherein adjusting the impedance at the first frequency of the first conductive path to ground is performed independently of adjusting the impedance at the second frequency of the second conductive path to ground for the electrically conductive element.

* * * * *